United States Patent [19]

Leuschner

[11] 4,287,439

[45] Sep. 1, 1981

[54] MOS BANDGAP REFERENCE

[75] Inventor: Horst Leuschner, Austin, Tex.

[73] Assignee: Motorola, Inc., Schaumburg, Ill.

[21] Appl. No.: 34,513

[22] Filed: Apr. 30, 1979

[51] Int. Cl.[3] .............................................. H01L 31/00

[52] U.S. Cl. .................................... 307/310; 307/297; 307/304; 330/256

[58] Field of Search ............... 307/251, 304, 310, 297; 330/256

[56] References Cited

U.S. PATENT DOCUMENTS 4,071,813 1/1978 Dobkin ................................ 307/310

4,158,804 6/1979 Butler .................................. 307/297

OTHER PUBLICATIONS

"Analysis and Design of Integrated Circuits" by Gray & Meyer, (Wiley & Son Publisher), pp. 254–261.

*Primary Examiner*—Harold A. Dixon

*Attorney, Agent, or Firm*—Anthony J. Sarli, Jr.; Vince Ingrassia; Jeffrey Van Myers

[57] ABSTRACT

A bandgap voltage reference source is provided which is temperature stable or temperature controlled and can be made by standard CMOS process. The reference has two substrate bipolar transistors with the emitter current density of one of the transistors being larger than the emitter current density of the other transistor. The transistors are used as emitter followers having resistors in their emitter circuits from which an error voltage is obtained. The error voltage is amplified through a differential or operational amplifier. Through the amplifier or through a resistor network, an output voltage higher or lower, respectively, than the bandgap voltage can be obtained. The output voltage can be made to have a positive, negative, or zero temperature coefficient.

8 Claims, 2 Drawing Figures

MOS BANDGAP REFERENCE

This invention relates, in general, to bandgap reference circuits, and more particularly, to metal oxide semiconductor (MOS) bandgap reference circuits.

In CMOS circuitry there are mainly three different kinds of reference voltages available. The first is a PN zener breakdown reference which is fixed at approximately 7 volts. The PN zener has a slightly positive temperature coefficient. The second kind of reference is a PN diode forward voltage reference of approximately 0.45 to 0.7 volts. The PN diode reference isn't considered a good reference because it has a negative temperature coefficient of approximately −2.5 millivolts per degree centigrade and is strongly dependent upon the biasing current. A third kind of reference is a MOSFET threshold ($V_T$) reference which has a temperature coefficient similar to the PN diode forward voltage reference and is also dependent upon biasing currents. In addition, the MOSFET threshold reference can have a wide unit-to-unit variation due to threshold variations caused by the manufacturing process.

In the past, the bandgap reference has been considered the best reference for a good reproducible temperature stable reference below 3 volts. However, the bandgap reference has been considered as a domain of bipolar circuits. The present invention takes advantage of the fact that a standard CMOS process can be used to build substrate bipolar transistors (emitter followers with the collector being the substrate).

R. J. Widlar has shown that a diode forward voltage is nearly a linear function of the absolute temperature and that the temperature coefficient of the diode forward voltage can be cancelled in a fairly wide temperature range by the temperature coefficient of the diode forward voltage differential. Basically, Widlar has shown that if the sum of a diode forward voltage drop plus a diode drop differential equals the energy gap of silicon, this sum value will nearly not change with temperature. All that is required to make a temperature stable reference voltage is to generate a $V_{BE}$ and add to this value a $\Delta V_{BE}$ of such value that the voltage of the series combinations equals the bandgap voltage of 1.205 volts.

Accordingly, it is an object of the present invention to provide a bandgap reference having substrate bipolar transistors and MOS transistors.

Yet another object of the present invention is to provide a MOS bandgap reference which is temperature stable and is independent of threshold variations.

A further object of the present invention is to provide a bandgap reference using standard CMOS process and having substrate bipolar transistors wherein the stable reference voltage is obtained from the emitters of the transistors.

SUMMARY OF THE INVENTION

In carrying out the above and other objects of the present invention, there is provided a first and a second substrate bipolar transistor wherein the emitter of the second transistor is much larger than the emitter of the first transistor. The same bias voltage is applied to both bases of the transistors which causes a different current density in the transistors since their emitter areas are different in size. Although as illustrated, the emitter areas of the substrate bipolar transistors are different, the desired result is that the emitter current densities be different in order to generate a $\Delta V_{BE}$ between the transistors. Resistors are connected in the emitter current path of the transistors and a reference voltage is obtained therefrom. The reference voltage is coupled to inputs of a differential amplifier where the reference voltage is amplified. The output of the differential amplifier then provides a controlled temperature voltage reference. In a preferred embodiment the differential amplifier is a CMOS differential amplifier.

If the first and second substrate bipolar transistors have emitters of the same area, then the emitter current densities can be controlled by the resistors connected to the emitters.

The subject matter which is regarded as the invention is set forth in the appended claims. The invention itself, however, together with further objects and advantages thereof, may be better understood by referring to the following detailed description taken in conjunction with the accompanying drawings.

DETAILED DESCRIPTION OF THE DRAWINGS

Figure 1:
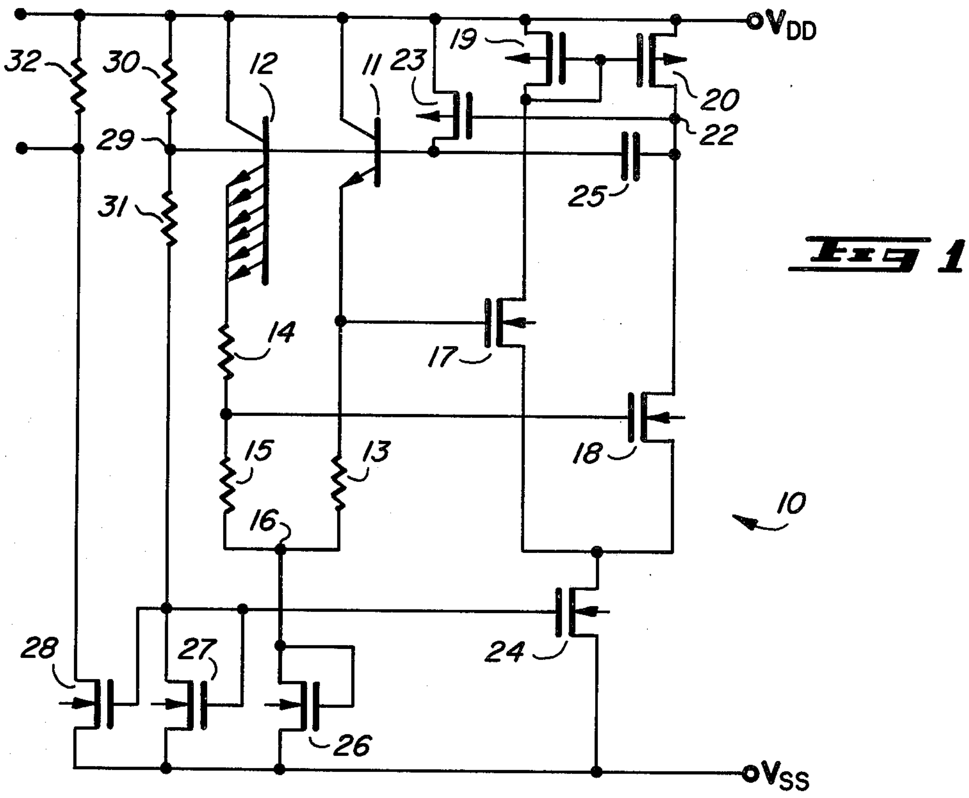
FIG. 1 illustrates in schematic form an embodiment, in one form, of the present invention.

In FIG. 1, a bandgap reference circuit 10 can provide both a temperature stable voltage and a temperature stable current. Transistors 11 and 12 are both substrate bipolar transistors which are obtained by standard CMOS process. As illustrated, the emitter area of transistors 12 is six times greater than the emitter area of transistor 11. If transistors 11 and 12 both carry the same amount of current, the current density of transistor 11 will be six times greater than the current density of transistor 12. However, resistors 13, 14 and 15 are selected such that transistor 11 will carry more current than does transistor 12. Resistor 13 is connected between the emitter of transistor 11 and node 16. Resistors 14 and 15 are connected in series between the emitters of transistor 12 and node 16. The collectors of transistors 11 and 12 are connected to a voltage terminal $V_{DD}$. Field effect transistors 17 through 20 along with transistor 24 form a CMOS differential amplifier. Transistors 17 and 18 are N-channel field effect transistors having their source electrodes connected to the drain electrode of N-channel transistor 24. Field effect transistor 24 serves as a current source for the differential amplifier. The source of transistor 24 is connected to voltage terminal $V_{SS}$. Transistors 19 and 20 are P-channel field effect transistors and each have one current carrying electrode connected to voltage terminal $V_{DD}$. Transistor 19 has another current carrying electrode connected to the drain of transistor 17. Transistor 20 has its other current carrying electrode connected to the drain of transistor 18. Transistors 19 and 20 form a current mirror and serve as load devices for the differential transistor pair 17 and 18. The gate electrodes of transistors 19 and 20 are connected together and to the drain electrode of transistor 17. A node 22 is formed between transistors 18 and 20 and serves as the output for the differential amplifier. Output node 22 is connected to a gate electrode of a P-channel field effect transistor 23. Transistor 23 serves as an output buffer for the differential amplifier and provides some gain. One electrode of transistor 23 is connected to voltage terminal $V_{DD}$. The other electrode of transistor 23 is connected to the bases of transistors 11 and 12 and to node 29. A capacitor 25 is coupled from the drain of transistor 18 to the base of transistor 11. Capacitor 25 is a frequency compensation capacitor which serves to prevent oscillations from occurring within circuit 10.

Circuit 10, as illustrated, has an N-channel transistor 26 coupled between node 16 and $V_{SS}$. Transistor 26 has its gate electrode connected to its drain which is commonly known as a FET (field effect transistor) diode configuration. Transistor 26 serves to compensate the absolute value of the threshold voltage of the field effect transistors in circuit 10 to get rid of temperature threshold variations. It should be noted that bandgap reference circuit 10 is capable of providing an output voltage greater than the bandgap voltage. However, if it were only desired to obtain a bandgap voltage of 1,205 volts then node 16 could be connected directly to voltage terminal $V_{SS}$.

The output of the differential amplifier which is provided through transistor 23 appears at node 29. The output voltage of node 29 is coupled by a resistor 31 to an N-channel transistor 27. Transistor 27 is connected in a diode configuration having its source electrode connected to voltage terminal $V_{SS}$. Transistor 27 serves as a current mirror with transistor 28 to establish a reference current through transistor 28. Transistor 28 is an N-channel transistor having its gate tied to the drain of transistor 27. The source of transistor 28 is connected to voltage terminal $V_{SS}$, and the drain of transistor 28 is connected to a resistor 32. The other end of resistor 32 is connected to voltage terminal $V_{DD}$. Transistor 28 establishes the current flow through resistor 32, and therefore, a predetermined voltage is dropped across resistor 32. The voltage developed across resistor 32, of course, can be changed by changing the ohmic value of resistor 32. Bandgap reference circuit 10 can provide a temperature stable current by replacing resistor 32 with a load for which a constant current source is desired.

A resistor 30 is coupled between voltage terminal $V_{DD}$ and node 29. Resistor 30 serves as a starter resistor which provides an initial biasing to the gate electrode of current source transistor 24. Resistor 30 is generally a very high valued resistor, in the order of 1 to 2 megohms. In some circuits, resistor 30 may not be required, especially, if leakage current between voltage terminal $V_{DD}$ and node 29 is high enough to provide biasing current for current source transistor 24. The gate electrode of transistor 24 is connected to the drain of diode connected transistor 27. This provides current source transistor 24 with a good stable biasing source and serves to increase the common mode gain of bandgap reference circuit 10. However, it should be noted that current source transistor 24 could be replaced by other current sources such as by a resistor where common mode gain is not too important.

The gain of the differential amplifier at a proper current biasing is at least 60 db, however, for the sake of simple explanation of the bandgap reference the amplifier gain is assumed to be infinite. This implies that with a closed negative feedback, both inputs to the differential amplifier are at the same voltage potential in a non-transient condition. This means that the voltage across resistors 13 and 15 are equal and therefore the ratio of the currents through resistors 13 and 15 is equal to the inverse of the resistor ratio. In the embodiment illustrated, emitter follower transistor 12 consists of a parallel combination of six transistors identical to emitter follower transistor 11. If resistor 13 is selected such that the emitter current to transistor 11 is six times more than the current through resistor 15 (which is also the current to the emitter of transistor 12) then the specific current density of transistor 11 will be thirty-six times more than the current density of transistor 12. Thus the base-emitter voltage of transistor 11 is then:

$$\begin{aligned} V_{BE11} &= V_{BE12} + \frac{kT}{q} \ln 36 \\ &= V_{BE12} + \frac{T}{T_o} (26 \text{ mv}) \ln 36 \\ &= V_{BE12} + (93 \text{ mv}) \frac{T}{T_o} \end{aligned}$$

where $V_{BE11}$ is the base emitter voltage of transistor 11 at temperature T, $V_{BE12}$ is the base emitter voltage of transistor 12 at temperature T, q is the charge of an electron, k is Boltzmann's constant, T is absolute temperature, and ln 36 is the natural log of the current density of transistor 11. The ratio $T/T_o$ is the ratio of absolute temperature over the operating temperature.

The voltage across resistor 14 is the difference in the base-emitter voltages between transistors 11 and 12 which as can be seen from the above equation is equal to 93 mv times $T/T_o$. For a bandgap reference voltage with respect to voltage potential $V_{SS}$, node 16 would be tied to $V_{SS}$ and the arbitrary restraint of resistor 15 divided by resistor 13 being equal to six along with the value of resistor 13 will have to be designed such that:

$$(93\text{mv}) \frac{T}{T_o} \left( \frac{R_{15}}{R_{14}} \right) + V_{BE11} = (93\text{mv}) \frac{T}{T_o} \left( 1 + \frac{R_{15}}{R_{14}} \right) + V_{BE12} = V_{GO}$$

where $R_{15}$ is the ohmic value of resistor 15, $R_{14}$ is the ohmic value of resistor 14, $V_{GO}$ is the bandgap voltage of 1.205 volts, and the other terms are as defined hereinbefore. Other reference voltages with respect to $V_{SS}$ can be derived from this 1.205 volt reference by attenuation or amplification. To obtain a reference with respect to a voltage different from $V_{SS}$, as an example $V_{DD}$, or to obtain a temperature stable current source then resistors 31 and 32 along with transistors 27 and 28 would be used.

To generate a temperature stable current, transistor 27 is connected as a diode. In this configuration the drain to source voltage equals the gate to source voltage, and at a given constant current can have a positive or negative temperature coefficient. At a low current density, the overruling temperature coefficient is a negative temperature coefficient of the threshold voltage while the transconductance effect can be neglected. At high current densities, the transconductance along with its negative temperature coefficient is the overruling factor and the negative temperature coefficient of the threshold voltage can be neglected so that the drain to source voltage has a positive temperature coefficient. To obtain proper temperature coefficient compensation, transistors 26 and 27 are designed to be biased in the range where the temperature coefficient of the drain to source voltage is small and can be positive or negative. With approximately every three degrees centigrade temperature rise the current through transistor 26 increases by 1% and the gate voltage minus the threshold voltage of transistor 26 increases about 0.5% on top of its own temperature coefficient. This causes node 16 to rise faster with temperature than does the drain of transistor 27. The voltage at node 29 would move parallel with the voltage at node 16 when the voltage difference between node 29 and 16 is equal to 1.205 volts. As can be easily seen, the bandgap reference not only can make a stable temperature coefficient reference but can also provide a controlled positive or negative temperature coefficient, if it is misadjusted above or below the bandgap voltage. It may be desirable to have a negative temperature coefficient in order to compensate for a positive temperature coefficient which results from the voltage drop variation across transistor 26 caused by the temperature coefficient of the current flow through the transistor. In circuit 10, in order to make a negative temperature coefficient of the voltage difference between nodes 29 and 16, the $\Delta V_{BE}$ must be decreased. This is accomplished by increasing the value of resistor 14 from the value it would have for an exact bandgap voltage. This reduces the $\Delta V_{BE}$ amplification factor expressed by the sum of the ohmic value of resistors 14 and 15 divided by the ohmic value of resistor 14. By changing the value of resistor 14 and/or geometry of transistor 26, a zero temperature coefficient of the current through resistor 31 can be achieved over a limited temperature range.

By way of example only the following are exemplary values of some of the components of FIG. 1. The field effect transistor ratios are in width-to-length ratio in microns whereas the resistor values are in ohms.

Figure 2:
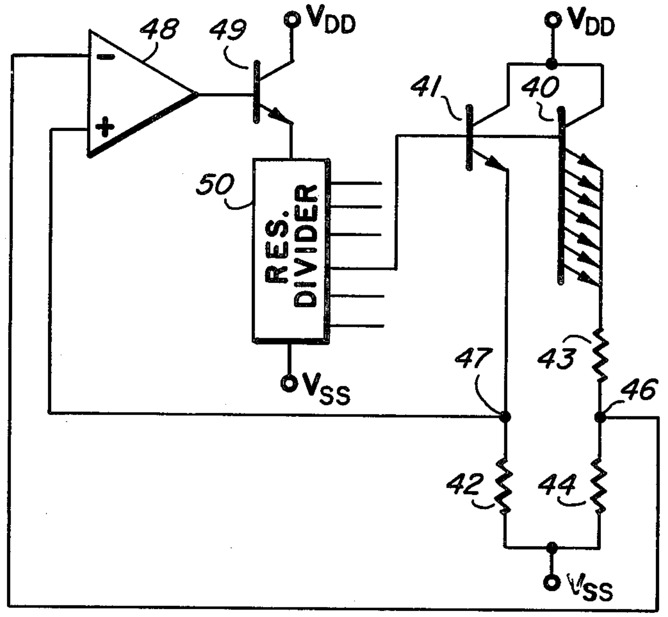
FIG. 2 illustrates the present invention in yet another form.

Transistor 27: 60/10
Transistor 26: 100/8
Transistor 24: 20/8
Transistor 17: 50/10
Transistor 18: 50/10
Transistor 19: 30/10
Transistor 20: 30/10
Transistor 23: 120/10
Resistor 31: 150 K
Resistor 14: 57 K
Resistor 15: 300 K
Resistor 13: 50 K FIG. 2 illustrates another embodiment of a CMOS bandgap reference having two substrate bipolar transistors 40 and 41 wherein the emitter area of transistor 40 is seven times greater than the emitter area of transistor 41. The collector of transistors 40 and 41 are connected to voltage terminal $V_{DD}$. The emitter of transistor 41 is connected to node 47. Node 47 is coupled by resistor 42 to voltage terminal $V_{SS}$. The emitters of transistor 40 are coupled to terminal $V_{SS}$ by two series connected resistors 43 and 44. A node 46 is formed between resistors 43 and 44. Node 46 is coupled to an inverting input of an operational amplifier 48 while node 47 is connected to the non-inverting input of operational amplifier 48. The output of amplifier 48 is connected to a base of a transistor 49. Transistor 49 is a substrate bipolar transistor and couples the output of amplifier 48 to a resistor divider 50. Resistor divider 50 is coupled between the emitter of transistor 49 and voltage terminal $V_{SS}$ and is capable of providing a plurality of output voltages. One of the output voltages from divider 50 is selected as a base drive for transistors 40 and 41. The selected voltage is preferrably the bandgap voltage, $V_{GO}$. The collector of transistor 49 is connected to voltage terminal $V_{DD}$. Transistor 49 provides a low impedance output to divider 50. It should be noted that transistor 49 could be replaced by a large P-channel transistor or even eliminated in the case where a large current is not needed to drive resistor ladder 50.

By way of example only, resistor 42 is 6,000 ohms, resistor 43 is 21,000 ohms, and resistor 24 is 84,000 ohms.

I claim:

1. A bandgap reference circuit comprising: a first voltage potential terminal; a second voltage potential terminal; a first transistor having a base, a collector, and an emitter, the collector being coupled to the first voltage potential terminal; a second transistor having a base, a collector, and an emitter, the collector of the second transistor being coupled to the first voltage potential terminal, the emitter current density of the first transistor being larger than the emitter current density of the second transistor; a first resistor coupled between the emitter of the first transistor and the second voltage potential terminal; a second and a third resistor connected in series and forming a node therebetween, the second and third resistors being coupled in series between the emitter of the second transistor and the second voltage potential terminal; an amplifier having field effect transistors and also having a first and a second input and an output, the first input being coupled to the emitter of the first transistor, and the second input being coupled to the node between the second and third resistors, the output of the amplifier providing the bandgap reference voltage, and the output being coupled to the bases of the first and second transistors.

2. The bandgap reference circuit of claim 1 wherein the amplifier is a CMOS amplifier.

3. The bandgap reference of claim 1 further including a plurality of resistors coupled in series between the output of the amplifier and the second voltage potential terminal.

4. The bandgap reference of claim 1 wherein the first resistor is smaller in ohmic value than the third resistor.

5. A reference circuit coupled between a first and a second voltage terminal, comprising: a first substrate bipolar transistor having a base, an emitter, and a collector, the collector being coupled to the first voltage terminal; a second substrate bipolar transistor having a base, an emitter, and a collector, the collector of the second transistor being coupled to the first voltage terminal, the emitter current density of the first transistor being larger than the emitter current density of the second transistor; a first resistor coupled between the emitter of the first transistor and the second voltage terminal; a second and a third resistor coupled in series between the emitter of the second transistor and the second voltage terminal, the second and third resistors forming a node therebetween; and a differential amplifier having an output and a first and a second input, the first input being coupled to the emitter of the first transistor, the second input being coupled to the node between the second and third resistors, and the output providing a temperature stable reference voltage.

6. The reference circuit of claim 5 wherein the differential amplifier is a CMOS amplifier having first and second field effect transistors (FET) of a first conductivity type each having a gate electrode and a first and a second electrode, each FET having its second electrode coupled together, the gate electrode of the first FET being coupled to the emitter of the first substrate bipolar transistor, the gate electrode of the second FET being coupled to the node between the second and third resistors; and third and fourth FETs of a second conductivity type each having a first and a second electrode and a gate electrode, the third and fourth FETs having their first electrode coupled to the first voltage terminal, the second electrode of the third FET being coupled to the first electrode of the first FET, the second electrode of the fourth FET being coupled to the first electrode of the second FET and providing the output for the differential amplifier, the gate electrodes of the third and fourth FETs being coupled together to the second electrode of the first FET; and a current source coupled from the second electrodes of the first and second FETs to the second voltage terminal.

7. The reference circuit of claim 6 further including a fourth resistor coupled to the output of the differential amplifier and a diode connected field effect transistor coupled from the fourth resistor to the second voltage terminal.

8. The reference circuit of claim 6 further including a diode connected field effect transistor coupled between the second voltage terminal and the first and third resistors.

* * * * *